United States Patent
Haluzak et al.

(10) Patent No.: US 7,541,209 B2
(45) Date of Patent: Jun. 2, 2009

(54) METHOD OF FORMING A DEVICE PACKAGE HAVING EDGE INTERCONNECT PAD

(75) Inventors: Charles C Haluzak, Corvallis, OR (US);
Chien-Hua Chen, Corvallis, OR (US);
David M Craig, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 483 days.

(21) Appl. No.: 11/251,412

(22) Filed: Oct. 14, 2005

(65) Prior Publication Data

US 2007/0087462 A1 Apr. 19, 2007

(51) Int. Cl.
*H01L 21/00* (2006.01)

(52) U.S. Cl. .......................... 438/48; 438/51

(58) Field of Classification Search ............. 438/48–53, 438/199–200, 455, 107–127, 622–629, 672–675
See application file for complete search history.

(56) References Cited

U.S. PATENT DOCUMENTS

| | | | | |
|---|---|---|---|---|
| 6,479,320 B1 * | 11/2002 | Gooch | .......................... | 438/109 |
| 6,696,343 B1 * | 2/2004 | Chinthakindi et al. | ....... | 438/379 |
| 6,815,220 B2 * | 11/2004 | Crawford et al. | ............... | 438/3 |
| 6,924,165 B2 | 8/2005 | Horning et al. | | |
| 6,936,491 B2 * | 8/2005 | Partridge et al. | .............. | 438/48 |
| 7,045,459 B2 * | 5/2006 | Freidhoff | .................... | 438/666 |
| 7,402,907 B2 * | 7/2008 | Ohguro | ....................... | 257/734 |
| 2003/0153116 A1 * | 8/2003 | Carley et al. | ................... | 438/53 |
| 2005/0067633 A1 * | 3/2005 | Mushika | ..................... | 257/202 |
| 2006/0125084 A1 * | 6/2006 | Fazzio et al. | ................. | 257/704 |
| 2006/0208326 A1 * | 9/2006 | Nasiri et al. | ................. | 257/414 |
| 2007/0004096 A1 * | 1/2007 | Heuvelman | .................. | 438/127 |
| 2007/0035001 A1 * | 2/2007 | Kuhmann et al. | ........... | 257/680 |
| 2007/0128828 A1 * | 6/2007 | Chen et al. | ................... | 438/458 |

FOREIGN PATENT DOCUMENTS

WO WO2005/061376 * 7/2005

* cited by examiner

*Primary Examiner*—Savitri Mulpuri
(74) *Attorney, Agent, or Firm*—Jeff D. Limon

(57) ABSTRACT

A method of forming a device package having an edge interconnect pad includes forming an array of MEMS devices overlaying at least one conductive via that electrically connects to an underlying layer. The method continues with depositing, by way of a damascene process, a conductive material on a substrate that is coplanar with the array of MEMS devices, the conductive material coupling to the at least one conductive via. The method also includes covering the array of MEMS devices and the conductive material with a passivation layer.

11 Claims, 4 Drawing Sheets

METHOD OF FORMING A DEVICE PACKAGE HAVING EDGE INTERCONNECT PAD

BACKGROUND

When fabricating devices and structures that include micro electromechanical systems (MEMS), electrical connections to the MEMS devices are generally made by way of subsurface electrical routing using vias that connect to bond pads adjacent to the devices in a horizontal direction. This consumes valuable substrate surface area that might otherwise be used for mounting electrical or mechanical devices that perform more productive functions. Consequently, as more substrate is consumed than necessary, electronic systems and assemblies that make use of MEMS devices are made larger and heavier than would be needed if higher MEMS device packing densities could be achieved.

DESCRIPTION OF THE EMBODIMENTS

Figure 1:
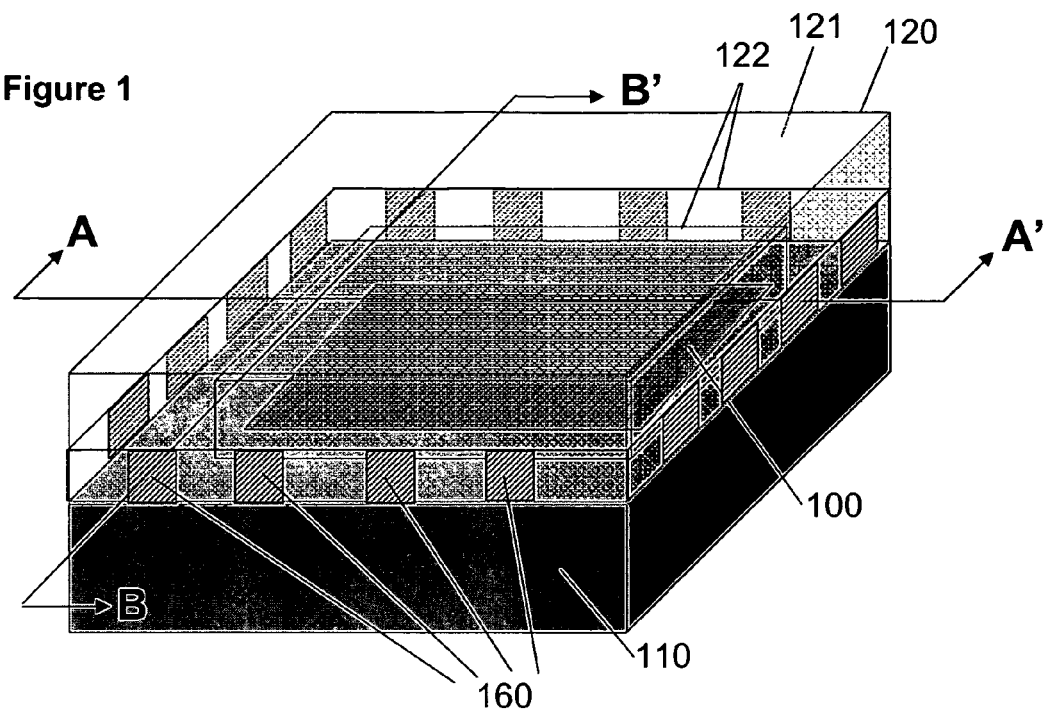
FIG. 1 is a perspective view of a MEMS device package having electrical interconnect pads present on the edge of the package according to an embodiment of the invention.

FIG. 1 is a diagram of a MEMS device package having electrical interconnect pads present on the edge of the package according to an embodiment of the invention. In FIG. 1, MEMS device layer 100 has been formed atop silicon substrate 110. It is contemplated that as part of a conventional silicon device fabrication process, MEMS device layer 100 is formed. MEMS device layer 100 may include any one of numerous MEMS devices such as accelerometers, micro engines, optical switches, gyroscopic devices, sensors, actuators, and so forth.

Figure 2:
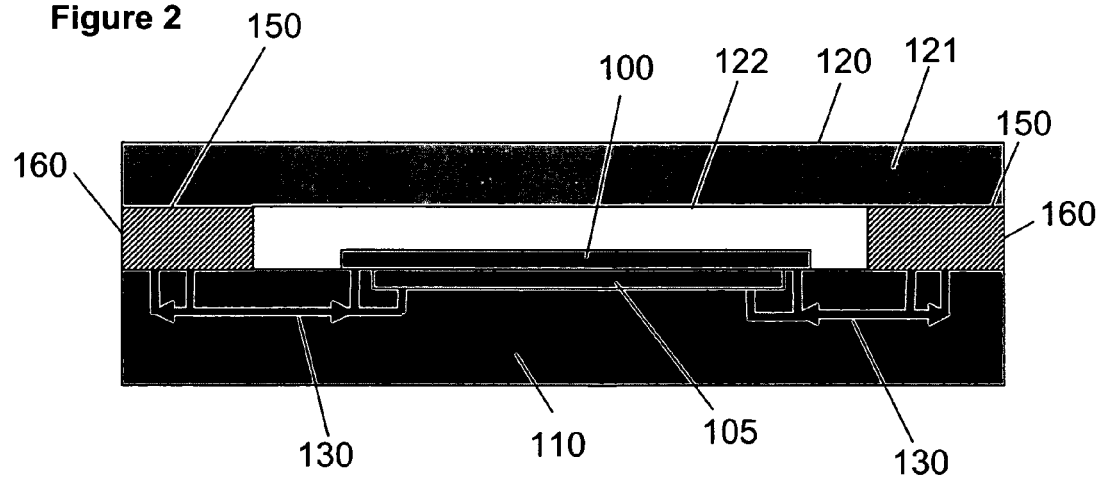
FIG. 2 is a sectional view that shows various features of the MEMS device package of FIG. 1 according to an embodiment of the invention.

In FIG. 1, a cover has been affixed atop MEMS device 100. In the embodiment of FIG. 1, cover 121 serves as a transparent glass membrane that protects an individually-controlled array of optically-reflective cantilevered mirrors. However, although the embodiment of FIG. 1 contemplates that cover 121 is a transparent glass membrane, in other embodiments of the invention, cover 121 may only represent a passivation layer that need not be transparent. In still other embodiments of the invention, cover 121 may be comprised of a ceramic material. As shown in FIGS. 1 and 2, cover 121 is defined by inner boundary 122, and outer boundary 120. Cover 121 may be affixed by way of hydrophilic fusion, low-temp plasma-assisted bonding, anodic bonding, Au—Si diffusion bonding, Au—Au compression bonding, solder bonding, or any one of numerous other techniques and processes.

Interconnect pads 160 of FIG. 1 represent outward-facing surfaces of a conductive channel that conveys electrical signals to and from the outer edge of MEMS device layer 100. For purposes of clarity, the bulk conductive material of the conductive channels, which extend outward from MEMS device layer 100, are not shown. Only the outward surfaces of these conductive channels are shown. Interconnect pads 160, which are present at all four lateral sides of the MEMS device package, provide a surface to which an interconnecting bond wire can be attached, thereby coupling the MEMS device package of FIG. 1 to adjacent devices and bonding pads. (FIG. 2 shows conductive channels 150 as well as interconnect pads 160.)

The inventors contemplate that the MEMS device package of FIG. 1 is fabricated as part of an array of similar MEMS and CMOS devices using a wafer fabrication process. Thus, the device package of FIG. 1 has been singulated from one or more other similar devices of the array. Additionally, in order to prepare the lateral surfaces of the MEMS device package of FIG. 1 for bonding to interconnecting wires, interconnect pads 160 may be plated or have additional metal deposited so as to provide a high-quality bonding surface of adequate size and shape.

FIG. 2 is a sectional view showing various features of the MEMS device package of FIG. 1 according to an embodiment of the invention. The plane of FIG. 2 has been taken along section line A-A' of FIG. 1, although the features shown in FIG. 2 are representative of features taken along other sectional lines that extend from one interconnect pad 160 to a corresponding interconnect pad on the opposite side of the device package, such as section line B-B'.

In FIG. 2, interconnect pads 160 are shown at the left and right edges of the MEMS device package. Conductive channels 150, etched in a seal ring the surrounds MEMS device layer 100, convey signals between MEMS device layer 100 and interconnect pads 160. These conductive channels thus provide an electrical interface between vias 130 and external devices. Vias 130 are contemplated as being holes etched in the substrate 110, which are filled with metal such as tungsten to provide connections to the interior of MEMS device 100 and CMOS device layer 105. Thus, by way of interconnect bonding pad 160, access to MEMS device layer 100, as well as underlying CMOS device layer 105 buried within silicon substrate 110, can be achieved. Although not shown in FIG. 1, vias 130 may provide an electrical connection to other device layers in silicon substrate 110.

The inventors contemplate that conductive channels 150 are formed in a seal ring that surrounds device layer 100 by way of a damascene process in which a pattern of conductive channels is first lithographically defined in the layer of dielectric and metal is deposited to fill the channels. Excess metal is then removed by way of chemical-mechanical planarization (CMP) which isolates the individual conductive channels from each other. A passivation layer can then be applied in order to protect the bare metal channels. In the embodiment of FIGS. 1 and 2, cover 121, which may be plasma-assisted bonded, for example, passivates the bare metal channels as well as providing mechanical protection of sensitive structures within MEMS device 100.

Figure 3:
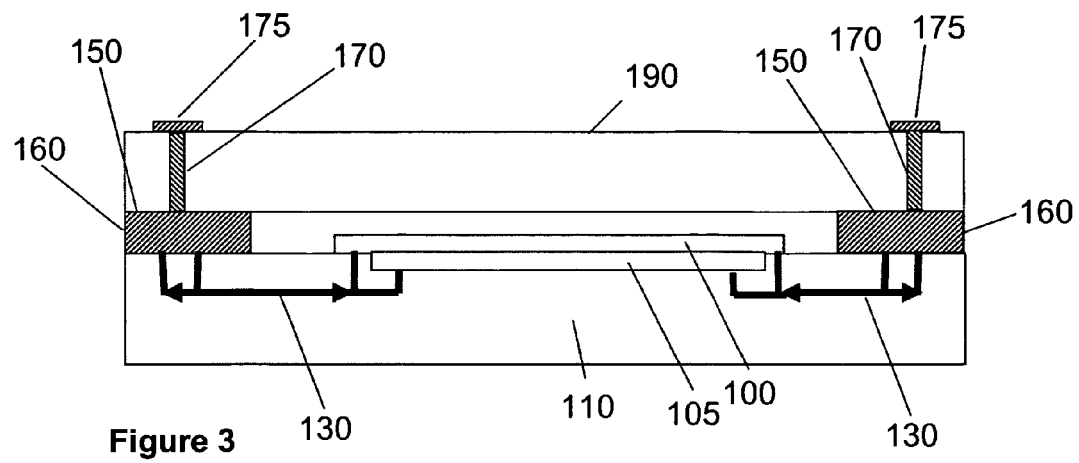
FIG. 3 is a sectional view of a MEMS device package having electrical interconnect pads present on the topside and the edge of the device package according to an embodiment of the invention.

FIG. 3 is a sectional view of a MEMS device package having electrical interconnect pads present on the topside and the lateral edges of the device package according to an embodiment of the invention. In FIG. 3, as in FIGS. 1 and 2, interconnect pads 160 and conductive channels 150 function to bring electrical signals to and from MEMS device layer 100 and CMOS device layer 105 by way of vias 130. The view of FIG. 3 is taken along a section line similar to line A-A' of FIG. 1.

In FIG. 3 cover 190 includes a plurality of conductive posts 170 prepared by way of electroplating, co-fired ceramic processes, deep reactive ion etch (DRIE), and so forth. The etched via is then backfilled with conductive material using sputter deposition, electroplating, by filling with molten solder, or the like. Each post 170 provides an electrical connection between the topside of the device package and conductive channel 150. At the top of each of conductive posts 170, conductive pad 175 is present which allows an electrical connection to be made with the device package and one or more external devices. Thus, the device of FIG. 3 provide connection to external devices by way of interconnect pad 160 in a horizontal direction as well as connection in the vertical direction by way of conductive posts 170 and conductive pad 175.

Figure 4:
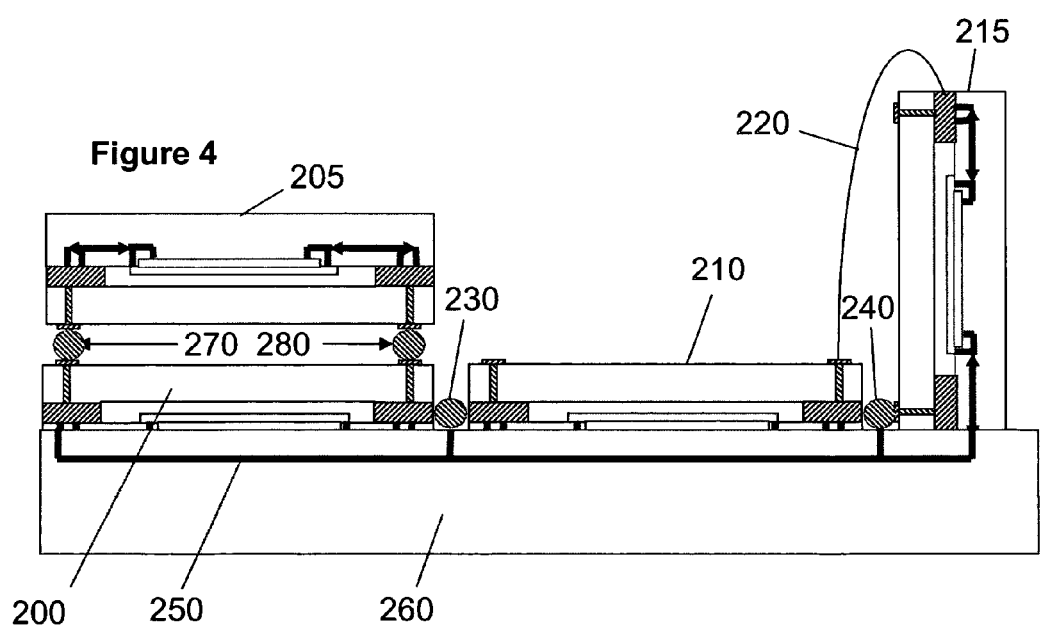
FIG. 4 is a sectional view of an arrangement of several MEMS device packages showing interconnections by way of edge and topside interconnection according an embodiment of the invention.

FIG. 4 is a sectional view of an arrangement of several MEMS device packages showing edge and topside interconnection according an embodiment of the invention. In FIG. 4, device packages 200, 205, and 215 are contemplated as being similar to the device package of FIG. 3. Thus, the features of FIG. 4 are shown along a section line, such as A-A' and B-B' as shown in FIG. 1. Thus, as each device package has four principal sides as well as multiple lateral and topside interconnect pads, a variety of bonding and interconnection arrangements are possible.

Multi-connection solder ball 230, placed between device packages 200 and 210, provides electrical connections between the two packages by way of an interconnect pad at the edge of each device package. Multi-connection solder ball 230 also provides an electrical connection from device packages 200 and 210 to via 250 located in substrate 260. Bond wire 220 provides an electrical connection between device packages 210 and 215.

In the embodiment of FIG. 4, device package 215 has been oriented on an edge in a manner that increases or optimizes packing density. Multi-connection solder ball 240 is shown connecting device packages 210 and 215 to via 250 located in substrate 260. Device package 205 is shown as being electrically connected, by way of topside interconnection, to device package 200 using multi-connection solder balls 270 and 280.

Figure 5:
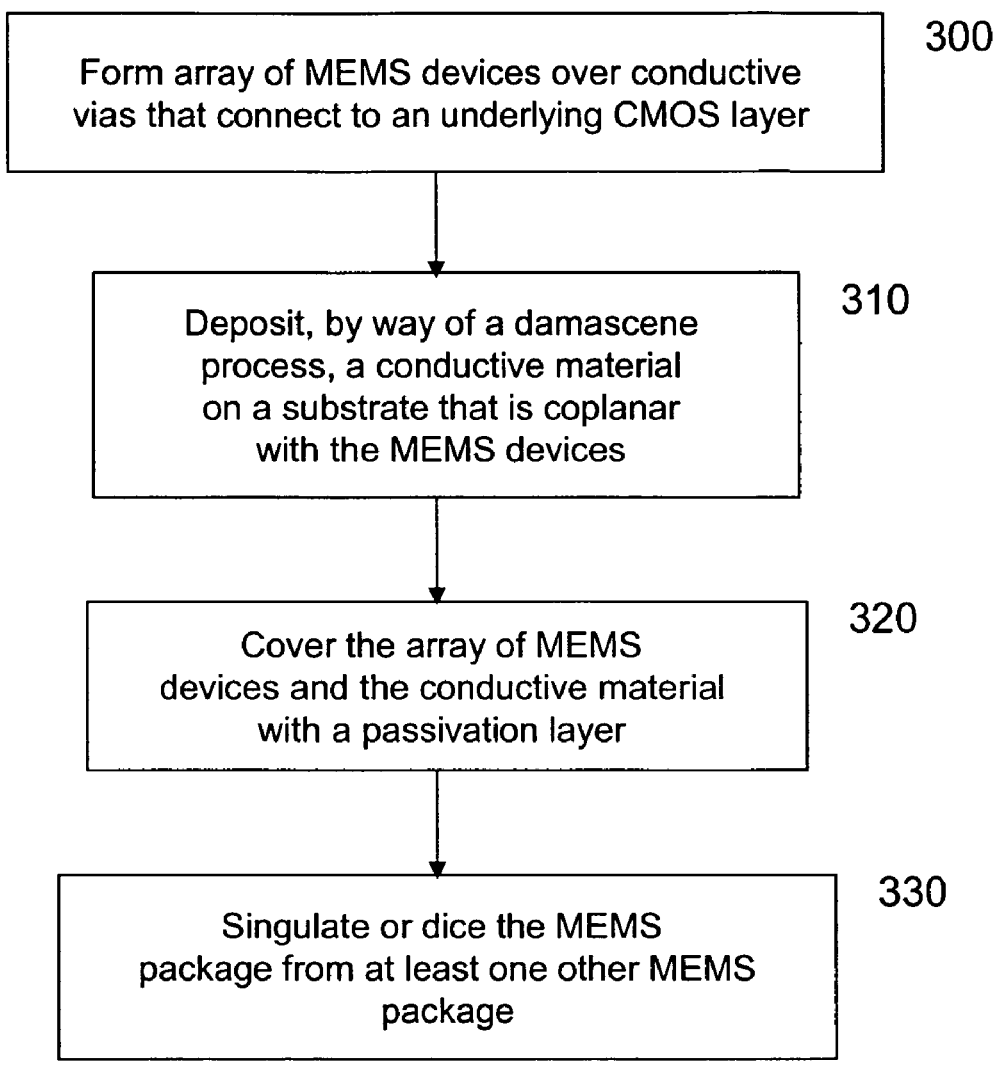
FIG. 5 is a flowchart for a method for forming an edge interconnect pad to a MEMS/CMOS device package according to an embodiment of the invention.

FIG. 5 is a flowchart for a method for forming an edge interconnect pad to a MEMS/CMOS device package according to an embodiment of the invention. The method FIG. 5 may be performed using conventional MEMS and CMOS fabrication equipment. The method begins at step 300 which includes forming an array of MEMS devices overlaying at least one conductive via that electrically connects and conveys signals to and from an underlying CMOS layer. The via may additionally directly connect to the MEMS layer. The method continues at step 310 which includes depositing, by way of a damascene process, a conductive material on a substrate that is coplanar with the array of MEMS devices. In step 310, the conductive material couples to the conductive via of step 300.

The method continues at step 320 in which the array of MEMS devices and the conductive material is covered with a passivation layer. In an embodiment of the invention, the passivation of step 320 includes affixing a transparent glass cover to the MEMS device and the conductive material. As discussed in reference to FIG. 3, the cover may include one or more conductive posts that couples to the conductive material deposited on the substrate, the conductive post providing an electrical connection by way of the topside of the cover. In other embodiments of the invention, step 320 includes depositing an oxide layer atop the conductive material and the array of MEMS devices. The method continues at step 330 in which the MEMS package is singulated or diced from at least one other (or perhaps an entire array) of other MEMS device packages.

Figure 6:
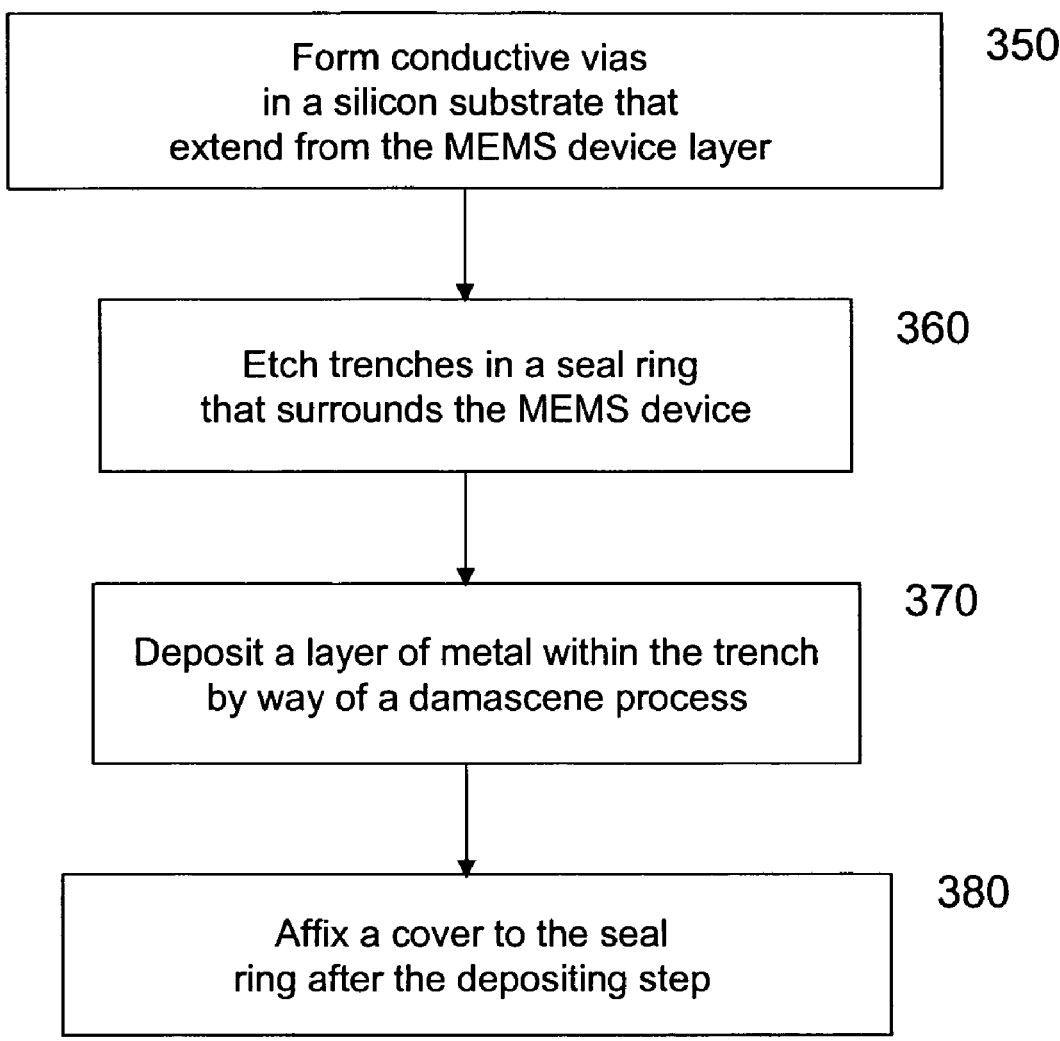
FIG. 6 is a flowchart for a method of electrically coupling to a MEMS device according to an embodiment of the invention.

FIG. 6 is a flowchart for a method of electrically coupling to a MEMS device according to an embodiment of the invention. The method of FIG. 6 begins at step 350 which includes forming at least one conductive via in a silicon substrate that extends from the MEMS device layer as part of the typical CMOS/MEMS device fabrication process. The method continues with step 360, which includes etching trenches in a seal ring that surrounds the MEMS device. The trenches etched in step 360 extend outward from the MEMS device and make electrical contact with conductive vias. At step 370, a layer of metal is deposited within the trench by way of a damascene process.

The method continues at step 380 which includes affixing a cover to the seal ring after the depositing step. In some embodiments of the invention, the cover performs a passivation function that protects the bare metal deposited and planarized during the damascene process. In other embodiments, the cover is a transparent glass material that provides a hermetic seal that protects the deposited metal as well as providing a window through which visible light may pass.

In conclusion, while the present invention has been particularly shown and described with reference to various embodiments, those skilled in the art will understand that many variations may be made therein without departing from the spirit and scope of the invention as defined in the following claims. This description of the invention should be understood to include the novel and non-obvious combinations of elements described herein, and claims may be presented in this or a later patent application to any novel and non-obvious combination of these elements. The foregoing embodiments are illustrative, and no single feature or element is essential to all possible combinations that may be claimed in this or a later patent application. Where the claims recite "a" or "a first" element or the equivalent thereof, such claims should be understood to include incorporation of one or more such elements, neither requiring nor excluding two or more such elements.

What is claimed is:

1. A method for forming an edge interconnect pad to a MEMS device package, comprising:
   forming an array of MEMS devices overlaying at least one conductive via that electrically connects to an underlying layer, wherein the underlying layer is a CMOS layer;
   depositing, by way of a damascene process, a conductive material on a substrate that is coplanar with the array of MEMS devices, the conductive material coupling to the at least one conductive via; and
   covering the array of MEMS devices and the conductive material with a passivation layer, wherein the cover includes a conductive post that couples to the conductive material deposited on the substrate, the conductive post providing an electrical connection by way of the topside of the cover.

2. The method of claim 1, wherein the covering step comprises affixing a substantially transparent cover to the MEMS device and the conductive material.

3. The method of claim 2, wherein the substantially transparent cover comprises glass.

4. The method of claim 1, wherein the covering step comprises depositing an oxide layer atop the conductive material and the array of MEMS devices.

5. The method of claim 1, further comprising singulating the MEMS device package from at least a second MEMS device package.

6. A method for enabling edge coupling to a MEMS/CMOS device package, comprising:
 forming an electrically conductive via in a CMOS layer;
 forming a MEMS device layer atop the CMOS layer, thereby creating a MEMS/CMOS device package;
 depositing, by way of a damascene process, a conductive channel that couples to the electrically conductive via and extends towards the edge of the MEMS/CMOS device package; and
 bonding a cover to the MEMS/CMOS device, wherein the cover overlays the conductive channel and the MEMS/CMOS device, wherein
 the cover includes a conductive post that couples to the conductive channel, the conductive post providing an electrical connection by way of the topside of the cover.

7. The method of claim 6, wherein the cover is substantially transparent.

8. The method of claim 7, wherein the cover is a glass.

9. The method of claim 6, further comprising separating the MEMS/CMOS device package from at least a second MEMS/CMOS device package.

10. The method of claim 7, further comprising bonding a wire to the outward surface of the conductive channel.

11. The method of claim 10 further comprising rotating the MEMS/CMOS device package prior to the bonding step.

* * * * *